United States Patent
Tuan

(10) Patent No.: US 6,355,105 B1
(45) Date of Patent: Mar. 12, 2002

(54) PROTECTING PHOTORESIST COATING SYSTEM BY PHOTOCHOPPER SENSOR

(75) Inventor: Roger Tuan, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/416,592

(22) Filed: Oct. 12, 1999

(51) Int. Cl.[7] .................... B05C 11/00; B05C 11/02; B05C 11/10; B05C 13/00; B05C 13/02
(52) U.S. Cl. .................... 118/688; 118/707; 118/52; 118/712
(58) Field of Search .................... 118/712, 688, 118/692, 707, 52, 600, 610, 319, 320; 427/8, 240

(56) References Cited

U.S. PATENT DOCUMENTS

| | | | | |
|---|---|---|---|---|
| 5,725,664 A | * | 3/1998 | Nanbu | .................... 118/52 |
| 5,878,301 A | * | 3/1999 | Katakura et al. | ............. 399/67 |
| 6,238,109 B1 | * | 5/2001 | Minami | ...................... 396/604 |

* cited by examiner

*Primary Examiner*—Richard Crispino
*Assistant Examiner*—Kevin P. Shortsle
(74) *Attorney, Agent, or Firm*—Powell, Goldstein, Frazer & Murphy LLP

(57) ABSTRACT

The invention disclosed herein is related to a photoresist coating system that significantly prevents performance of the system being degraded by any bubble in, liquid photoresist. The proposed system comprises a pump, a series of pipelines, a reactor, a tank, a capacitor sensor, a photochopper sensor and a controller, where the capacitor sensor is coupled to the pipeline and the photochopper sensor is coupled to the pipeline. Thus, any bubble inside the pipeline is detected by the capacitor sensor or the photochopper sensor. In other words, any bubble in the photoresist is detected. The operation of the present photoresist coating system is terminated by the controller to protect any wafer inside the reactor, and a warning alarm is activated by the controller.

6 Claims, 3 Drawing Sheets

PROTECTING PHOTORESIST COATING SYSTEM BY PHOTOCHOPPER SENSOR

BACKGROUND OF THE INVENTION

1. Field of the Invention

This invention is generally directed to rendering an operation condition of a photoresist coating system. More specifically, the present invention relates to a photoresist coating system that efficiently limits any damage caused by any bubble in photoresist.

2. Description of the Prior Art

Because most available photoresists are liquid, it is necessary to pump photoresist from a reservoir to a reactor where photoresist is dispensed and coated on a wafer. Moreover, in most present photoresist coating systems, not only are both pump and pipeline desired, but also a tank is inserted into the pipeline to adjust a flow rate of photoresist before the photoresist is pumped into the pump and sent to the reactor. In other words, the photoresist coating system is designed to let the photoresist be continually and uniformly dispensed on the wafer.

Of course, owing to the fact that in many contemporary semiconductor processes several kinds of photoresists are required, most available photoresist coating systems comprise several pumps, several reservoirs and several tanks, and only one reactor. However, only one reservoir, one pump, one tank and one pipeline are desired for each kind of photoresist.

It is well known that the forming process of the photoresist layer is affected by existence of bubbles in photoresist. When any bubble is pumped into the pump, it also is sent into the reactor, therefore, the quantity of photoresist that is dispensed on the wafer is fluctuant and the distribution of photoresist on the wafer also is not uniform, and then the quality of photoresist layer is degraded by the bubble. In addition, the source of bubbles comprises the incomplete sealing of pipelines of the photoresist coating system and improper operation of the pump of the photoresist coating system.

To avoid possible disadvantages of the existence of the bubble, conventional photoresist coating systems broadly use a capacitor sensor to detect the existence of the bubble. A capacitor sensor is attached to the tank, and particularly is attached on the sidewall of the tank, and the existence of a bubble will change the capacitance and will be detected.

However, the detecting ability of the capacitor sensor is limited by several factors. First, the sensitiveness of the capacitor sensor is dependent on the density of photoresist. The lower the density is, the worse the sensitivity. Second, manual adjustment is necessary to adjust the critical point of response of the capacitor sensor. In other words, when a different photoresist is used, the capacitor sensor must be adjusted and it is difficult to properly adjust it. Besides, when photoresist with low density is used, the exactness of the capacitor sensor is bad.

Additionally, in most of conventional photoresist coating systems, the tank is not adjacent to the pump, thus, any bubble formed inside a section of pipeline between the tank and the pump could not be detected by the capacitor sensor.

Therefore, according to the previous discussion, it is crystal-clear that capacitor sensor cannot provide enough protection to prevent any bubbles pumped into pump and reactor, and it is necessary to develop a new photoresist coating system to provide the required protection.

SUMMARY OF THE INVENTION

A primary object of the invention is to prevent the quality of photoresist coating system from being degraded by bubbles in photoresist.

An additional object of the invention is to improve the quality of photoresist layer that formed on a wafer.

A further object of the invention is to propose a photoresist coating system that is suitable for many kinds of photoresist.

The related embodiment of the present invention is a photoresist coating system for coating a photoresist layer where material of photoresist is liquid. The present embodiment comprises: a pump for pumping photoresist from a reservior into photoresist coating system, a tank for maintaining a flowing rate of photoresist in an approximately fixed value before it is pumped into the pump, a reactor where photoresist is dispensed and coated on a wafer to form photoresist layer, a first pipeline for conveying photoresist from reservoir to tank, a second pipeline for conveying the photoresist from the tank to the pump, and a third pipeline for conveying the photoresist from the pump to the reactor.

Moreover, the embodiment further comprises a capacitor sensor that is coupled to the tank, a photochopper sensor that is coupled to the second pipeline and a controller that is coupled to both capacitor sensor and photochopper sensor. Therefore, any bubble inside the tank is detected by the capacitor sensor and any bubble inside the second pipeline is detected by the photochopper sensor. When a warning message from these sensors is received by the controller, the controller will alarm and terminate the operation of the photoresist coating system.

In short, the key points of the invention comprise both capacitor sensor and photochopper sensor used to detect the existence of a bubble in the photoresist, and a controller is used to alarm and terminate operation of the system when a bubble is detected by at least one sensor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The content of the proposed invention can be explained and understood by the following embodiments with the corresponding figures.

Figure 1:
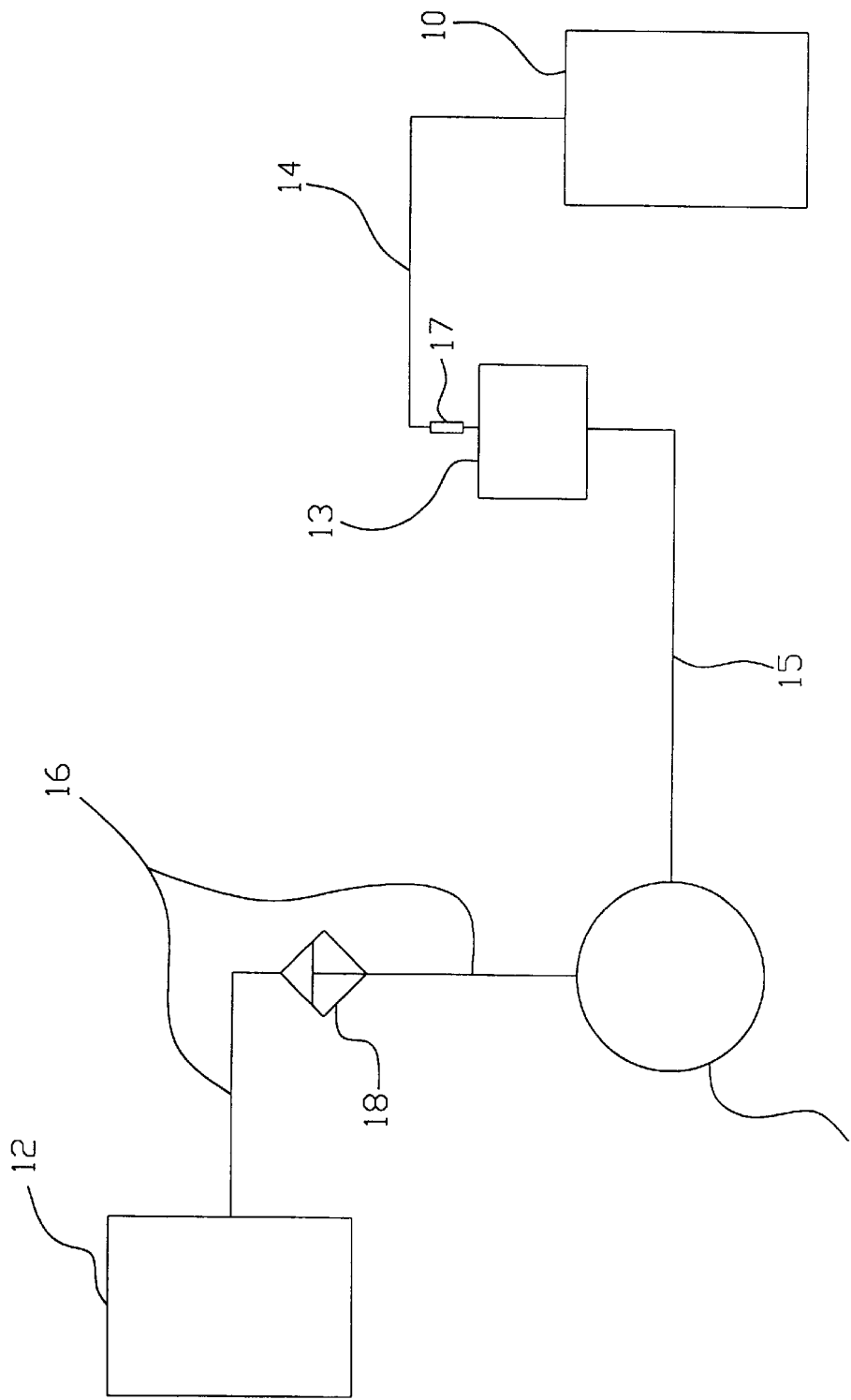
FIG. 1 is brief illustration of a conventional photoresist coating system and a reservior of photoresist.

In order to provide a significant comparison, a conventional photoresist coating system for coating a photoresist layer on a wafer is illustrated in the following paragraphs, where the photoresist is liquid. As shown in FIG. 1, the conventional photoresist coating system comprises the following assembles: pump 11, reactor 12, tank 13, first pipeline 14, second pipeline 15, third pipeline 16 and capacitor sensor 17. Herein, filter 18 is an optional part to filter any impurity in the photoresist.

As FIG. 1 shows, pump 11 is used to pump the photoresist from reservoir 10 into the conventional photoresist coating system. Moreover, photoresist is transported through pump 11 into reactor 12 where photoresist is dispensed and coated on wafer to form photoresist layer. Tank 13 is used to maintain a flowing rate of photoresist in an approximately fixed value before photoresist is pumped into pump 11 and sent to reactor 12. First pipeline 14 conveys photoresist from reservoir 10 to tank 13, second pipeline 15 conveys photoresist from tank 13 to pump 11 and third pipeline 16 conveys photoresist from pump 11 to reactor 12 where a process such as dispensing is executed.

Obviously, in the conventional photoresist coating system, such as TEL MK-8 Track that is provided by Tokyo Electron Co. LTD (TEL), only one kind of sensor, capacitor sensor 17, is used. Capacitor sensor 17 is coupled to first pipeline 14 and is used to detect the existence of a bubble in photoresist. Therefore, once bubbles exist inside first pipeline 14, capacitor sensor 17 will indicate it.

The first embodiment of the invention is a photoresist coating system for coating a photoresist layer on a wafer, where the photoresist is liquid. The first embodiment is illustrated in the following paragraphs.

Figure 2:
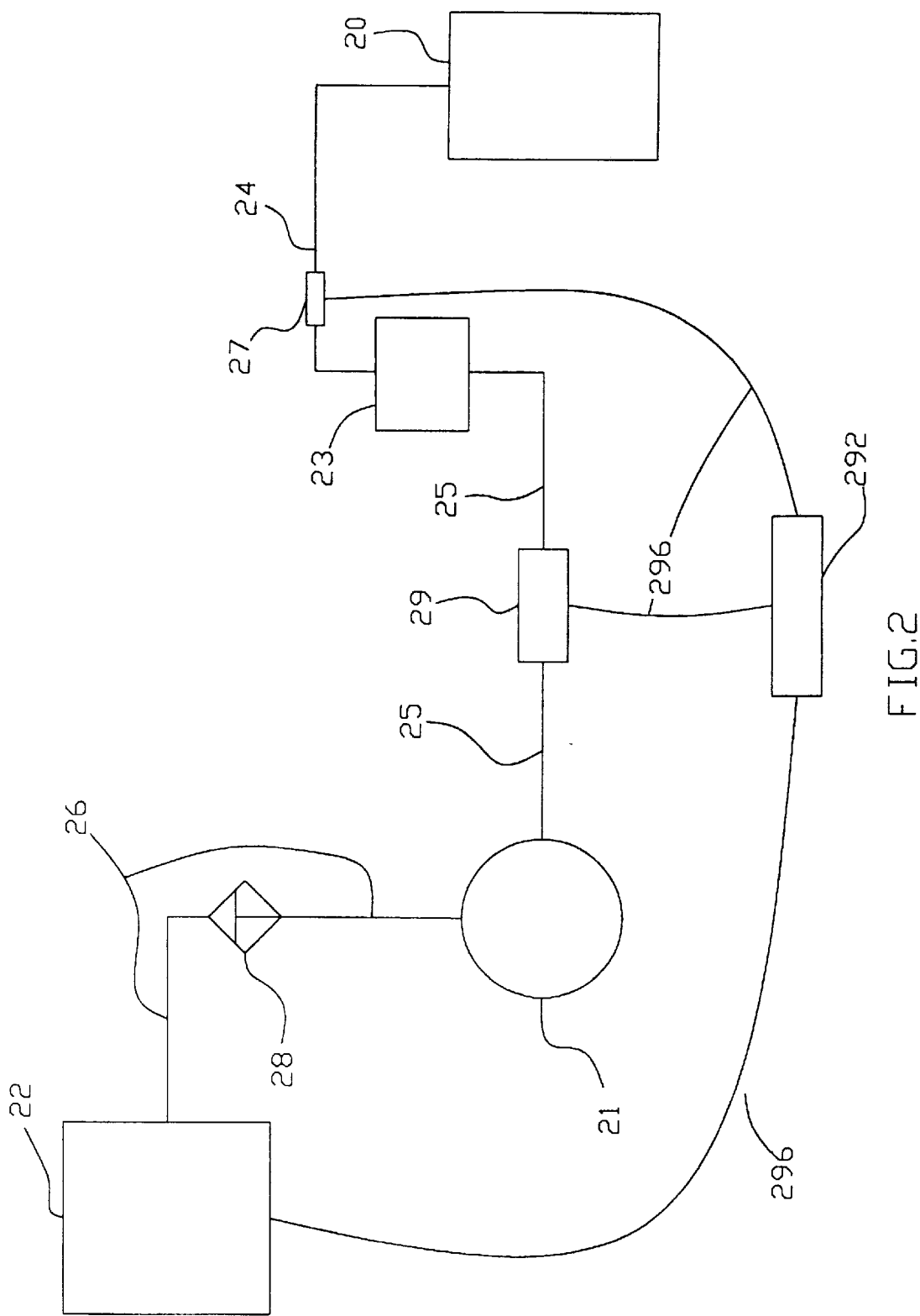
FIG. 2 is a brief illustration of a presented photoresist coating system and a reservior of photoresist in accordance with one embodiment of the present invention.

As FIG. 2 shows, the proposed photoresist coating system comprises the following assembles: pump 21, reactor 22, tank 23, first pipeline 24, second pipeline 25, third pipeline 26, capacitor sensor 27, photochopper sensor 29 and controller 292. Herein, filter 28 also is an optional part to filter any impurity in photoresist.

In the embodiment, the conveying mechanism of photoresist is similar to conventional photoresist coating systems. Pump 21 is used to pump photoresist from reservoir 20 into the proposed photoresist coating system, and photoresist is transported through pump 21 into reactor 22 where photoresist is dispensed and coated on the wafer to form the photoresist layer. Tank 23 is used to maintain a flowing rate of photoresist in an approximately fixed value before photoresist is pumped into pump 21 and sent to reactor 22. Besides, first pipeline 24 conveys photoresist from reservoir 20 to tank 23, second pipeline 25 conveys photoresist from tank 23 to pump 21 and third pipeline 26 conveys photoresist from pump 21 to reactor 22.

It should be noted that two kinds of sensors are used in the embodiment, both capacitor sensor 27 and photochopper sensor 29 are used. And controller 292 will receive a warning message when any bubble is detected by at least one sensor.

In the embodiment, capacitor sensor 27 is coupled to first pipeline 24 and is neighboring to tank 23. Capacitor sensor 27 is used to detect existence of bubble in photoresist, and particularly is used to detect existence of bubble inside first pipeline 24. Thus, when bubbles exist inside first pipeline 24, especially when bubbles are closed to tank 23, capacitor sensor 27 will send a first warning message to controller 292.

Comparing FIG. 1 and FIG. 2, the proposed embodiment is basically similar to the conventional photoresist coating system and the main difference is application of a photochopper sensor and a controller.

According to FIG. 2, the main characteristics of the embodiment is that photochopper sensor 29 is inserted into second pipeline 25 and is used to detect the existence of a bubble in the photoresist, and particularly is used to detect the existence of bubble inside second pipeline 25. Thus, when bubbles exist inside second pipeline 25, photochopper sensor 29 will send a second warning message to controller 292.

When controller 292 receives a warning message, regardless of whether is a first warning message or a second warning message, controller 292 will alarm and terminate operation of the photoresist coating system of the present invention. Thus, the detected bubble will not be pumped into reactor 22 and will be prevented from inducing any problems. It should be noted that the terminating function also is an important characteristic of the invention.

For example, in order to provide the terminating function, controller 292 can comprises a switch that is in series with a power line of the present photoresist coating system, and the switch is turned off when controller 292 receives a warning message. Therefore, when any bubble is detected by capacitor sensor 27 or photochopper sensor 29 or both sensors, controller 292 will receive a warning message and turn off the switch to terminate operation of the present photoresist coating system. Then any wafer inside reactor 22 is prevented from being affected by detected bubble. Moreover, the safety mechanism of the present invention is disclosed in detail in another embodiment.

Owing to the fact that the forming probability of bubble in photoresist is proportional to the length and bend of a pipeline that photoresist is conveyed inside. It is obvious that in order to reduce the probability that any bubble is formed after photoresist is detected by both capacitor sensor 27 and photochopper sensor 29, not only photochopper sensor 29 should be closed to pump 21, but also a section of second pipeline 25 between photochopper sensor 29 and pump 21 should be shortened and straightened to prevent the formation of a bubble. In other words, in order to reduce the probability that any bubble is formed after photoresist is detected by both capacitor sensor 27 and photochopper sensor 29, it is better to let photochopper sensor 27 be adjacent to pump 26.

Consequentially, filter 28 is used to filter any impurity in photoresist before the photoresist is pumped into reactor 22, and it is broadly connected to both pump 21 and reactor 22 by third pipeline 26. Of course, filter 28 also can be inserted into second pipeline 25 or first pipeline 24, but this is not a restriction of the embodiment.

Because in most contemporary semiconductor fabrications there are a lot of dies on a wafer and each die corresponds to several photoresist layers, several kinds of photoresists are required by a photoresist coating system at the same time. In other words, there are several pumps, several group of pipelines and several tanks in a photoresist coating system, and each kind of photoresist corresponds to a tank, a group of pipelines and a pump. Because only a reactor is used and all kinds of photoresists are conveyed into the reactor, it is obvious that regardless in which tank or which pipeline the bubble appears, the operation of the photoresist coating system must be terminated to protect the wafer inside the reactor.

Referring to following paragraphs, the safety mechanism is disclosed and the corresponding embodiment illustrates the case that three kinds of photoresist are used. Obviously, there are three conveying assembly in the embodiment and each assembly corresponds to a tank, a pump, a capacitor sensor and a photochopper sensor. However, the embodiment has only one reactor, and all kinds of photoresist are transported into the same reactor.

Figure 3:
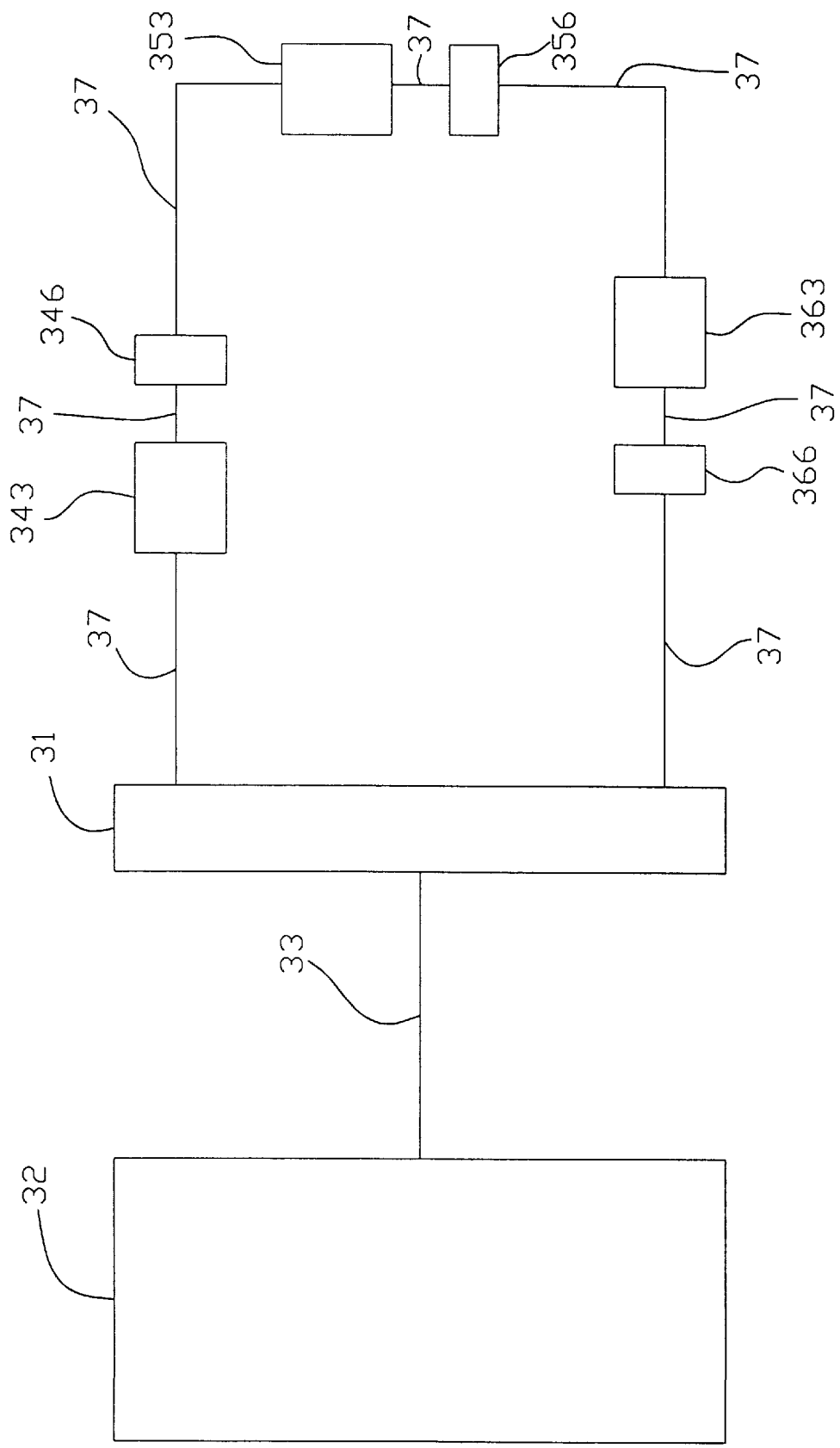
FIG. 3 is a brief illustration of a safety mechanism of the invention in accordance with another embodiment of the present invention.

As FIG. 3 shows, wherein three kinds of photoresist are used by the provided photoresist coating system, controller 31 is coupled to reactor 32 by first signal line 33 and is coupled to several devices by second signal line 37, where these devices are in series to each other. These devices comprise first capacitor sensor 343, first photochopper sensor 346, second capacitor sensor 353, second photochopper sensor 356, third capacitor sensor 363 and third photochopper sensor 366. Moreover, first capacitor sensor 343 and first photochopper sensor 346 correspond to first photoresist, second capacitor sensor 353 and second photochopper sensor 356 corresponds to second photoresist, third capacitor sensor 363 and third photochopper sensor 366 corresponds to the third photoresist.

Therefore, once any bubble appears in any kind of photoresist and is detected by any sensor, second signal line 37 will conduct a warning message to controller 31. Then, controller 31 will alarm and terminate the operation of the provided system.

Obviously, because all sensors are coupled in series, the design of controller 31 is simplified for warning message that can be treated as a lack of an initial signal. In such case, controller 31 sends an initial signal into second signal line 37 and the initial signal is conducted through all sensors and is returned to controller 31. Besides, each sensor is designed to cut off second signal line 37 when any bubble is detected by the sensor. Therefore, if controller 31 can receive the initial signal then no bubble is detected. On the contrary, if controller 31 cannot receive the initial signal, this means that bubble is detected and then controller 31 will alarm and terminate operation of the provided system.

Regardless, though in the embodiment all sensors are coupled in series, the invention should not be limited to such a case. These sensors also can be coupled in sequence and the only restriction of the invention is that controller 31 must alarm and terminate operation of the photoresist coating system, including reaction of reactor 32 and all pumps, once any bubble is detected by any sensor.

Of course, though in the embodiment only the case of three kinds of photoresist is illustrated, the invention is not restricted by the kind of photoresist. The safety mechanism can be summarized as follows. Once any bubble is detected by any sensor, the controller will receive a warning message from the sensor and then the controller will terminate the operation of the provided photoresist coating system.

According to the previous discussion, the key points of the invention includes the fact that both the capacitor sensor and the photochopper sensor are used to detect the existence of a bubble in the photoresist, and a controller is used to alarm and terminate operation of the photoresist coating system of the present invention when any bubble is detected by any sensor.

Regardless, though only a photoresist coating system is discussed in these embodiments, the spirit of the invention can be used by any system where liquid is pumped from a reservoir and is sent into a pump and a reactor. Obviously, the photochopper sensor and the controller can be used in all systems to detect the existence of a bubble and terminate operation of all systems.

While the invention has been described by these embodiments, the invention is not limited thereto. To the contrary, it is intended to cover various modifications, procedures and products. The scope of the appended claims therefore should be accorded the broadest interpretation so as to encompass all such modifications and similar arrangements, procedures and products.

What is claimed is:

1. A photoresist coating system for coating a liquid photoresist layer on a wafer, said photoresist coating system comprising:

a pump for pumping said photoresist from a reservoir;

a tank, wherein said tank maintains a flowing rate of said photoresist in an approximately fixed value before said photoresist is pumped into said pump;

a first pipeline for conveying said photoresist from said reservior to said tank;

a second pipeline for conveying said photoresist from said tank to said pump;

a reactor, wherein said photoresist is dispensed and coated on said wafer to form a photoresist layer;

a third pipeline for conveying said photoresist from said pump to said reactor;

a capacitor sensor, wherein said capacitor sensor is coupled to said first pipeline and is used to detect existence of bubble in said photoresist;

a photochopper sensor, wherein said photochopper sensor is coupled to said second pipeline and is used to detect existence of bubbles, said photochopper sensor being adjacent to said pump; and a controller, wherein said controller is coupled to both said capacitor sensor and said photochopper sensor, and wherein said controller alarms and terminates an operation of said photoresist coating system when a warning message from said sensors is received by said controller.

2. The system according to claim 1, wherein said capacitor sensor neighbors to said tank.

3. The system according to claim 1, wherein said controller further comprise a switch that is in series with a power line of said photoresist coating system, and wherein said switch is turned off when said warning message is received.

4. The system according to claim 1, furthers comprising a filter to filter a plurality of impurities in said photoresist before said photoresist is pumped into said reactor.

5. The system according to claim 4, wherein said filter is located within a passage way of said third pipeline.

6. The system according to claim 1, wherein the section of said second pipeline between said photochopper sensor and said pump is straightened.

* * * * *